United States Patent [19]

McElroy et al.

[11] Patent Number: 4,805,138
[45] Date of Patent: Feb. 14, 1989

[54] AN UNERASABLE EPROM CELL

[75] Inventors: David McElroy, Houston; Timmie M. Coffman, Sugar Land; Buster Ashmore, Houston, all of Tex.

[73] Assignee: Texas Instruments Incorporated, Dallas, Tex.

[21] Appl. No.: 768,787

[22] Filed: Aug. 23, 1985

[51] Int. Cl.$^4$ .................. G11C 7/02; G11C 19/00; H01L 25/04
[52] U.S. Cl. ............................ 365/53; 365/218; 357/84
[58] Field of Search ............ 365/51, 53, 149, 218, 365/DIG. A, 200; 357/84

[56] References Cited

U.S. PATENT DOCUMENTS

| | | | |
|---|---|---|---|
| 4,513,304 | 4/1985 | Takemae | 357/41 |
| 4,519,050 | 5/1985 | Folmsbee | 365/218 |
| 4,530,074 | 7/1985 | Folmsbee | 357/84 |
| 4,587,542 | 5/1986 | Rao | 357/23.11 |
| 4,641,165 | 2/1987 | Iizuka et al. | 365/149 |

Primary Examiner—Terrell W. Fears
Assistant Examiner—Melissa J. Koval
Attorney, Agent, or Firm—Theodore D. Lindgren; Thomas W. DeMond; Melvin Sharp

[57] ABSTRACT

An electrically programmable memory cell of a type having a source, a drain, a floating gate and a control gate formed over a face of a semiconductor substrate in which a ring region of material doped similarly to the substrate encloses the source, drain and gates and extends to a surface of the substrate around its length. Drain and source coupling regions of material doped oppositely to the substrate contact the drain and source, respectively, within the ring and extend under the ring to the substrate surface outside of the ring defining drain and source contact regions, respectively. A contact outside the ring to the control gate is provided by a gate coupling region also extending under the ring to a substrate surface on either side thereof. An interconnect couples the floating gate to the gate coupling region. A non-light transmitting, electrically conducting shield extends over the cell contacting the ring region around its periphery at the substrate surface.

6 Claims, 1 Drawing Sheet

AN UNERASABLE EPROM CELL

RELATED APPLICATIONS

The present application discloses subject matter with respect to which our copending application Ser. No. 768,669 entitled AN UNERASABLE EPROM CELL filed Aug. 23, 1985, is pertinent.

FIELD

The present invention relates to semiconductor memory devices or more particularly, to an unerasable electrically programmable read only memory device.

BACKGROUND OF THE INVENTION

EPROMS utilize memory elements which rely on avalanche injection of electrons to an electrically isolated floating gate in order to program the device. The charge stored on this floating gate may be removed by exposing it to UV light. In some applications there is a need for a one-time programmable EPROM the programmed condition of which is unaffected by UV light. Examples of such potential uses include redundancy circuits, custom reconfiguration and parameter storage. One attempt at providing such a device is disclosed in an article by Alan C. Folmsbee in the 1983 edition of IEDM at page 574 entitled "PROM Cell Made With An EPROM Process". The Folmsbee device consists of a double polycrystalline silicon floating-gate EPROM cell that employs a metal shield. The shield contacts the substrate adjacent the floating gates and extends over the floating gates and therebeyond a distance of the order of 80 micrometers overlying an elongated thin wafer of silicon dioxide. A second metal contact adjacent the elongated end of the shield has a cap portion extending toward the former end to define a narrow shield opening. UV light entering the silicon dioxide wafer through the shield opening undergoes refraction according to Snell's law so that all rays will travel at an angle of less than 42 to the perpendicular and undergo a number of reflections as they travel toward the floating gates. With each reflection from the silicon substrate a significant fraction of the light is absorbed thereby attenuating the UV intensity. Obviously, the Folmsbee device does not eliminate the effect of UV light but merely reduces its effect by an amount which is approximately proportional to the length of the shield extension. However, a long shield is inconsistent with a need to maximize the density of EPROM cells on a substrate.

It is therefore a principal object of this invention to provide an improved electrically programmable floating gate MOS device. Another object is to provide a floating gate EPROM which has an improved resistance to erasure by UV radiation.

SUMMARY OF THE INVENTION

According to the invention there is provided an electrically programmable memory cell of a type having a source, a drain, a floating gate and a control gate formed over a face of a semiconductor substrate in which a ring region of material doped similarly to the substrate encloses the source, drain and gates and extends to a surface of the substrate around its length. Drain and source coupling regions of material doped oppositely to the substrate contact the drain and source, respectively, within the ring and extend under the ring to the substrate surface outside of the ring defining drain and source contact regions, respectively. A contact outside the ring to the control gate is provided by a gate coupling region also extending under the ring to a substrate surface on either side thereof. An interconnect couples the floating gate to the gate coupling region. A non-light transmitting, electrically conducting shield extends over the cell contacting the ring region around its periphery at the substrate surface.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENT

Figure 1:
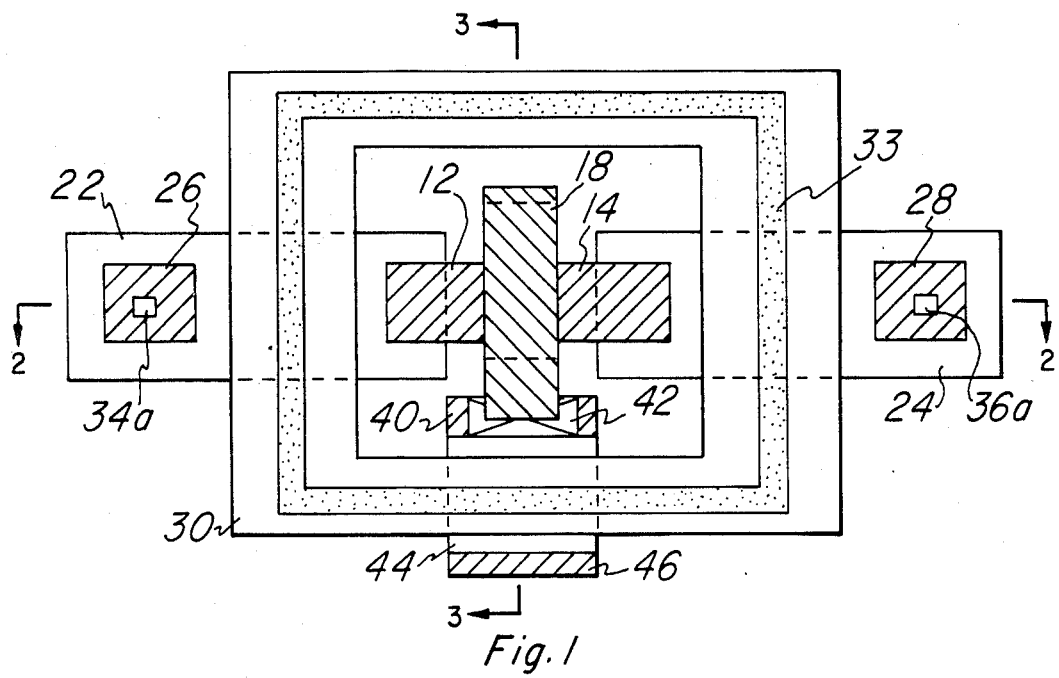
FIG. 1 is a greatly enlarged plan view of a small portion of a semiconductor chip showing the physical layout of one cell of an unerasable EPROM array.
Figure 2:
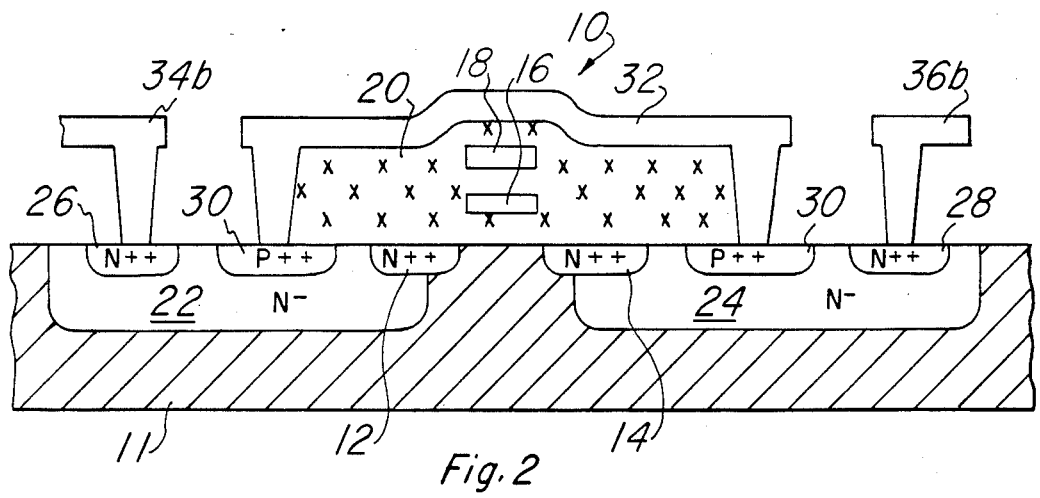
FIGS. 2 and 3 are elevation views in section of the cell of FIG. 1 taken along the lines 2—2 and 3—3, respectively.
Figure 3:
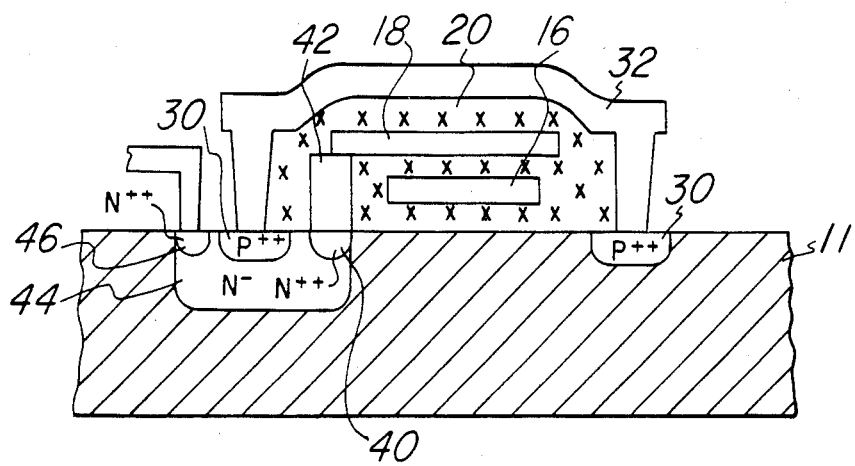

Referring to FIGS. 1, 2 and 3, there is formed an unerasable electronically programmable read only memory cell 10 over a face of a P-type substrate body 11. Cell 10 consists of a conventional floating gate transistor comprising N++ source and drain regions 12 and 14, respectively, a floating gate 16, a control gate 18 and silicon dioxide insulation 20 between the gate 16 and substrate 11, and between the gates themselves.

Three N-type strips are formed at right angles to each other. A source coupling region 22 contacts source 12 at an inner end thereof, drain coupling region 24 contacts drain 14 at an inner end thereof and gate coupling region 44 contacts a control gate interconnect 42 at an inner end thereof. The control gate interconnect 42 contacts an extended portion of the control gate 18 which extends beyond the floating gate 16 as seen best in FIG. 3. A rectangular P++ ring region 30 is formed around the gates 16 and 18, the source 12 and drain 14 passing through the source coupling region 22, the drain coupling region 24 and the gate coupling region 44. On portions outside of ring region 30 of source, drain and gate coupling regions 22, 24, 44, respectively, there are implanted N++ type source, drain and gate contact regions 26, 28 and 46, respectively. Contact regions 26 and 28 have contact areas 34a and 36a, respectively, to which metal contacts 34b and 36b respectively, couple.

A metal shield 32 is deposited over the silicon dioxide insulation 20 which is previously patterned and etched so as to leave a ring contact area 33 (see FIG. 1) open. The shield 32 thus completely encapsulates the cell 10 down to the surface of the P++ ring region on the substrate surface and prevents ultraviolet light from penetrating the silicon dioxide 20 and erasing or discharging the floating gate 16. The P++ ring region provides electrical isolation of the electrically conducting shield 32 from the source, drain and gate coupling regions 22, 24 and 44, respectively, and contact with the P-substrate 11.

Obviously, different geometrics may be used such as a circular one in which the source and drain define an annular source to drain channel with annular gates and a circular shield. All such geometrics are equivalent and are contemplated by the present invention.

Other variations, modifications and departures lying within the spirit of the invention and scope as defined by the appended claims will be obvious to those skilled in the art.

What is claimed:

1. An electrically programmable semiconductor memory cell of a type having a source, a drain, a floating gate, a control gate and gate insulation formed over a face of a semiconductor substrate, comprising:

a ring region of material doped similarly to said substrate enclosing said source, drain, floating gate and control gate and formed at a surface of said substrate;

a drain and source coupling region each doped oppositely to said substrate and contacting respective drain and source regions, extending under said ring and to a surface of said substrate exterior to said ring to respective drain and source contact regions;

a gate coupling region doped oppositely to said substrate extending under said ring region for interconnecting said control gate to a gate contact outside of said ring;

interconnect means for connecting said gate coupling region to said control gate; and a non-light transmitting electrically conducting shield completely encapsulating said gates and gate insulation above said ring and contacting said ring region around its periphery for shielding said cell against transmission of UV light into an interior thereof.

2. A memory cell as in claim 1, wherein said shield is metal.

3. A memory cell according to claim 1, wherein said substrate is P-type, said drain, source and gate coupling regions are N-type and said ring region is P++ type semiconductor material.

4. A memory cell according to claim 1, wherein said control gate extends beyond said floating gate at an extended end thereof and said connecting means is a metal interconnect contacting a bottom of said control gate at an extended end thereof and extending down to said gate coupling region at a surface of said substrate.

5. A memory cell according to claim 4, wherein said control gate and said floating gate are both polycrystalline silicon.

6. A memory cell according to claim 3, wherein said ring is rectangular in plan and said control gate and floating gate are substantially straight.

* * * * *